United States Patent [19]
Case

[11] Patent Number: 6,023,513
[45] Date of Patent: *Feb. 8, 2000

[54] SYSTEM AND METHOD FOR IMPROVING CLARITY OF LOW BANDWIDTH AUDIO SYSTEMS

[75] Inventor: Eliot M. Case, Denver, Colo.

[73] Assignees: U S West, Inc., Denver; MediaOne Group, Inc., Englewood, both of Colo.

[ * ] Notice: This patent issued on a continued prosecution application filed under 37 CFR 1.53(d), and is subject to the twenty year patent term provisions of 35 U.S.C. 154(a)(2).

[21] Appl. No.: 08/587,126
[22] Filed: Jan. 11, 1996
[51] Int. Cl.$^7$ .................................................. H03G 3/00
[52] U.S. Cl. .............................. 381/61; 381/98; 381/102
[58] Field of Search ................................ 381/101, 98, 61, 381/102, 16, 1, 2, 3

[56] References Cited

U.S. PATENT DOCUMENTS

| | | |
|---|---|---|
| 3,828,133 | 8/1974 | Ishigami et al. . |
| 4,150,253 | 4/1979 | Knoppel ................................. 381/101 |
| 5,133,014 | 7/1992 | Pritchard ................................. 381/61 |
| 5,359,665 | 10/1994 | Werrbach ................................. 381/102 |
| 5,422,602 | 6/1995 | Werrbach . |
| 5,424,488 | 6/1995 | Werrbach . |

*Primary Examiner*—Minsun Oh Harvey
*Attorney, Agent, or Firm*—Brooks & Kushman

[57] ABSTRACT

A system and method for improving clarity of an audio signal to be transmitted over a limited bandwidth communication channel selects predetermined frequencies of the audio signal for processing and adds even harmonic distortion to the selected frequencies such that the distortion is added within the limited bandwidth of the transmission channel. The system and method are particularly suited for telephony applications and may be utilized in hearing aids due to the effectiveness of clarifying voice signals. In addition, the system and method may be applied to other very low bandwidth signals, such as data compressed audio signals, computer voice files, computer audio files, and numerous other technologies which have an audio response less than normal human perception. The technique also applies to the use of perceptually coded audio.

9 Claims, 4 Drawing Sheets

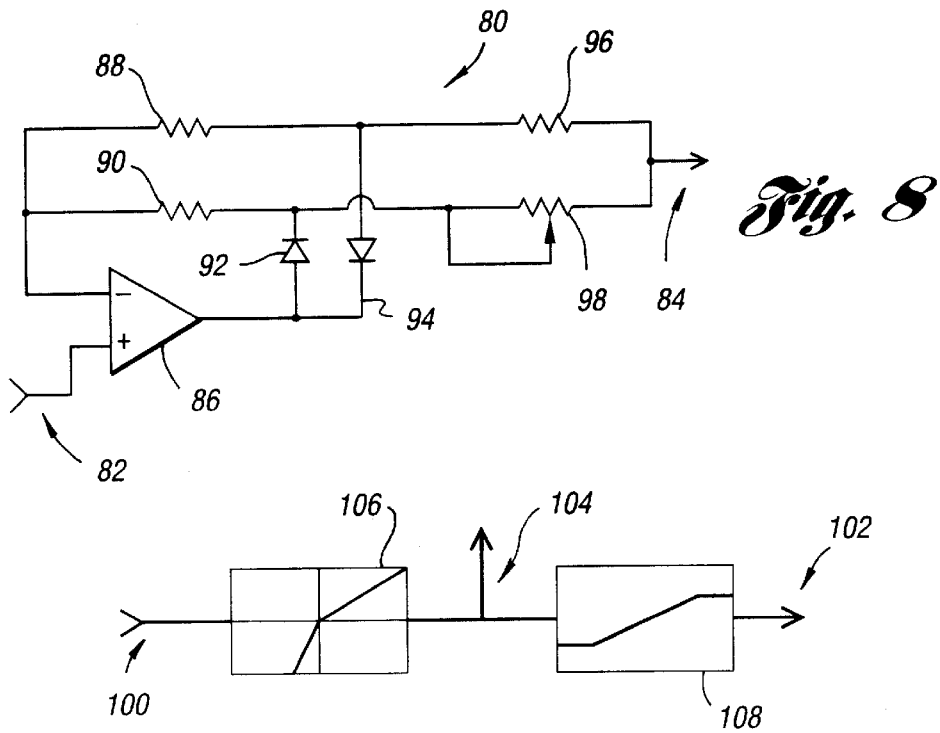
*Fig. 8*
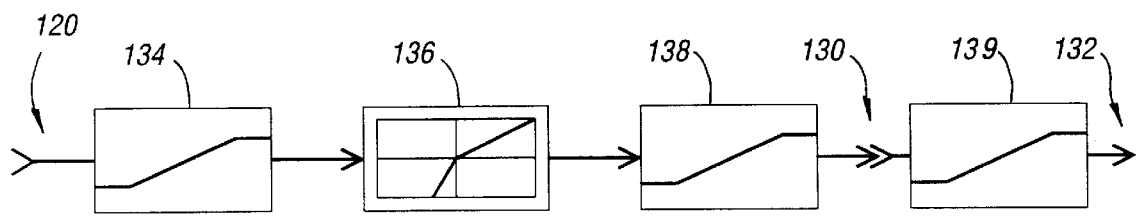
*Fig. 9*
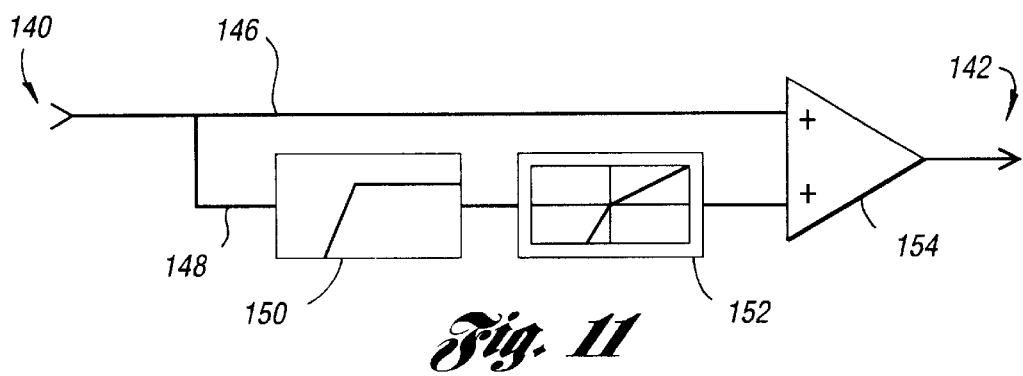
*Fig. 10*
*Fig. 11*

SYSTEM AND METHOD FOR IMPROVING CLARITY OF LOW BANDWIDTH AUDIO SYSTEMS

TECHNICAL FIELD

The present invention relates to a system and method for improving the quality, clarity, and intelligibility of limited bandwidth audio signals by adding even harmonic distortion.

BACKGROUND ART

The process of adding harmonic distortion, particularly even harmonic distortion, to improve the clarity of audio signals is known in the field of audio signal processing. U.S. Pat. Nos. 3,828,133; 4,150,253; 5,133,014; and 5,359,655 disclose processes in which the audio signal is divided into two signal paths. One signal path is utilized to generate the harmonic distortion which is then combined with the other signal path to produce and enhance the audio signal. The combined signal is perceived to be of higher quality when even harmonic distortion is used. This is particularly true when the audio signal is a voice signal.

Processes for producing even harmonic distortion have been employed in wide bandwidth (20 Hz to 20 KHz) signal processing, i.e. high fidelity audio signals. For example, U.S. Pat. No. 5,424,488 discloses a harmonics generator which may be used to improve the sound quality of electronic audio equipment.

Harmonic distortion has also been used to clarify certain bandwidth limited signals, such as telephone audio signals. A typical bandwidth for a telephone signal is about 4 KHz, ranging from about 150 Hz to 3900 Hz. Prior art systems for use in telephony applications improve clarity of the audio signal by adding even harmonics of particular frequencies at the receiver so as to "fill-out" the spectrum which was limited by the communication channel. Thus, the added harmonic frequencies are typically outside of the 4 KHz bandwidth of the telephone transmission line. As such, this method requires the audio processing to be performed at the receiver; otherwise, any added distortion would be filtered out by the transmission channel.

It is desirable to provide a system and method which may be used to clarify limited bandwidth audio signals at any point in the transmission path. In telephony applications, this allows selective utilization and control of the clarification process by individual customers.

It is further desirable to provide a system and method which reduces the number of electronic components necessary to impart even harmonic distortion to an audio signal by providing a single signal path. This allows miniaturization of the system for appropriate applications, such as use in hearing aids and the like.

SUMMARY OF THE INVENTION

An object of the present invention is to provide a system and method for improving audio clarity of limited bandwidth signals which may be utilized at any point in the transmission path.

It is also an object of the present invention to provide a system and method for improving the quality, clarity, and intelligibility of limited bandwidth audio signals by adding even harmonic distortion within the limited bandwidth of a system.

A further object of the present invention is to provide a system and method for improving the clarity of an audio signal which may be implemented utilizing a single signal path.

A still further object of the present invention is to provide a system and method for improving clarity of a voice signal by adding even harmonic distortion to those frequencies below a predetermined ratio of the upper limit of the limited bandwidth.

Yet another object of the present invention is to provide a system and method for improving the clarity of a voice signal by applying a transfer function having an asymmetrical gain about zero (or a small offset) so as to emphasize the even harmonics of the voice signal.

In carrying out the above objects and other objects and features of the present invention, a method for improving clarity of an audio signal to be transmitted over a limited bandwidth system is provided. The method includes selecting predetermined frequencies of the audio signal for processing and adding even harmonic distortion to the selected frequencies. The predetermined frequencies are selected so that the added even harmonic distortion is within the limited bandwidth of the system. As such, a method according to the present invention may be utilized at any point of the transmission path. In one embodiment of the present invention, second harmonic distortion is added to frequencies which are less than about one fourth of the limited bandwidth of the system. In another embodiment, even harmonic distortion is generated by applying a transfer function to selected frequencies where the transfer function is characterized by a first gain which is applied to positive half-cycles of the voice signal and a second gain which is applied to negative half-cycles of the voice signal. The first gain is greater than the second gain and the frequencies are selected so that the added even harmonic distortion is within the limited bandwidth of the system.

A system for implementing a method according to the present invention is also disclosed.

The objects and advantages of the present invention are readily apparent from the following detailed description of the best mode for carrying out the invention when taken in connection with the accompanied drawings.

BRIEF DESCRIPTION OF THE DRAWINGS

FIG. 6b illustrates a representative audio output signal produced by applying the transfer function of FIG. 5 to the input audio signal of FIG. 6a;

FIG. 8 is a circuit schematic illustrating one possible implementation of a non-linear transfer function for producing second harmonic distortion according to the present invention;

FIG. 9 is a signal flow block diagram illustrating a method for second harmonic generation according to the present invention;

FIG. 10 is a signal flow block diagram illustrating an alternative embodiment for even harmonic distortion generation using a single signal path according to the present invention;

FIG. 11 is a signal flow block diagram illustrating an alternative method for generating even harmonic distortion using dual signal paths;

BEST MODE FOR CARRYING OUT THE INVENTION

Figure 1:
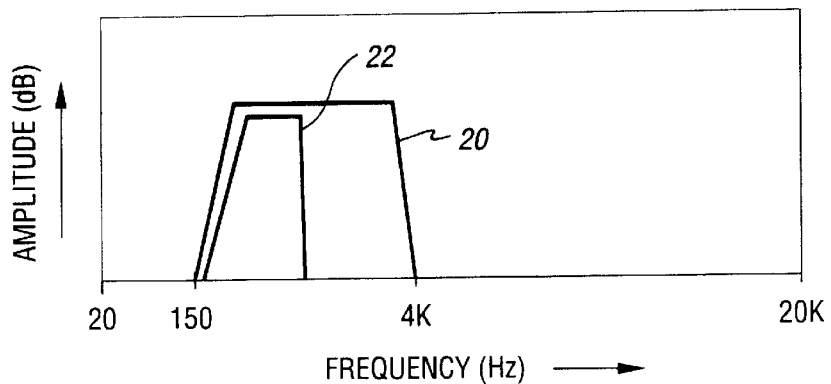
FIG. 1 is a diagram illustrating a typical bandwidth for a limited bandwidth receiver, such as those used in telephony applications.

Referring now to FIG. 1, a diagram is shown illustrating a representative bandwidth for a limited bandwidth system such as that used in telephony applications. Bandwidth 20 extends from about 150 Hz to about 4 KHz and may represent the limited bandwidth of a receiver or of a transmission channel. A portion of the frequencies within bandwidth 20, as represented by bandwidth 22 are selected for processing according to the present invention. This selection may be performed electronically by a band pass filter, or may be implemented by a programmed microprocessor in digital applications, as is well known in the art. Bandwidth 22 preferably excludes low frequencies and has a range of about 150 Hz to about 1.5 KHz. Bandwidth 22 may have a lower cut-off frequency which is equal to the lower cut-off frequency of the limited bandwidth channel 20, if desired.

Figure 2:
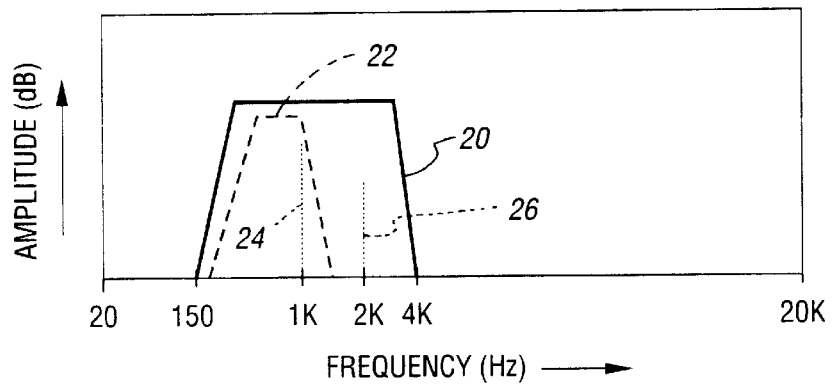
FIG. 2 is a diagram illustrating addition of even harmonic distortion within the limited bandwidth of the system according to the present invention.

Referring now to FIG. 2, addition of even harmonic distortion within the bandwidth of a limited bandwidth transmission system is shown. An audio input signal having frequency components within bandwidth 22, such as component 24, is acted upon by a circuit or system according to the present invention to produce even harmonic distortion, such as frequency component 26. Appropriate selection of frequencies within bandwidth 22 maintains the harmonic distortion within the limited bandwidth of the channel or receiver 20. Because the even harmonic distortion is added within the transmission bandwidth 20, the enhanced audio signal may be transmitted over the communication channel so that any receiver will receive the higher fidelity sound. This process improves the clarity, quality, and intelligibility of the limited bandwidth signal and may be applied at the transmitting end, or anywhere in the communication link. This allows selective implementation and control when needed or desired as determined by the user. This is a significant advantage over prior art systems which add even harmonic distortion outside of the transmission bandwidth since those systems may only be employed at the receiver. Thus, the present invention allows centralized processing of audio signals rather than distributed processing which requires electronics and/or software at each receiver.

Figure 3:
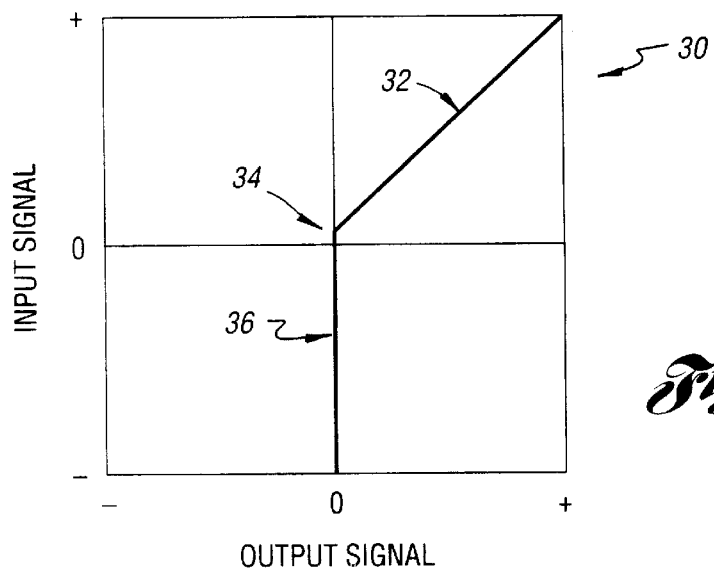
FIG. 3 is a diagram illustrating a non-linear transfer function for generating even harmonic distortion.

Referring now to FIG. 3, a diagram illustrating a non-linear transfer function for generation of even harmonic distortion according to the present invention is shown. The transfer function, indicated generally by reference numeral 30, may be implemented by an electronic circuit, a programmed microprocessor, or a combination of the two, as known in the art. An electronic circuit implementation of a similar transfer function is illustrated and described with reference to FIG. 8. Transfer function 30 of FIG. 3 includes a linear portion 32, an offset 34 and a clipping portion 36. An output signal may be determined by projecting points on an input signal along the horizontal axis until they intercept the transfer function at which point they are projected vertically and plotted on a corresponding time scale for the output signal.

Figure 4A:
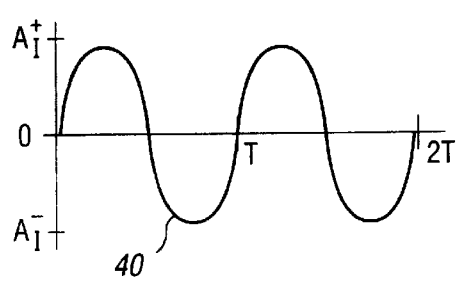
FIG. 4a illustrates a representative audio input signal.
Figure 4B:
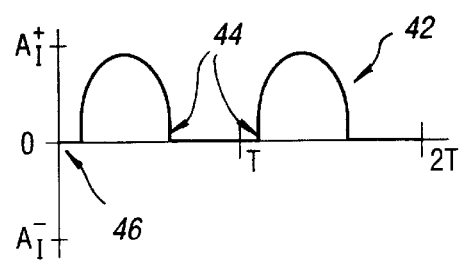
FIG. 4b illustrates an audio output signal produced by the input signal of FIG. 4a after passing through a system having a transfer function such as that Illustrated in FIG. 3.

FIGS. 4a and 4b illustrate a representative input and corresponding output signal, respectively, after applying the transfer function of FIG. 3 to the input signal of FIG. 4a. As illustrated, a representative input signal 40 is a sine wave having a period of T and amplitude $A_I$. After applying the transfer function of FIG. 3, an output with even harmonics is produced as illustrated in FIG. 4b. The output wave form 42 also has a period of T and an amplitude of $A_O$. The amplitude of the output, $A_O$, may be less than, equal to, or greater than the corresponding amplitude $A_I$ of the input depending on the slope of portion 32 of transfer function 30. Output waveform 42 includes linear portions 44 and 46 due to the offset 34 of transfer function 30.

Figure 5:
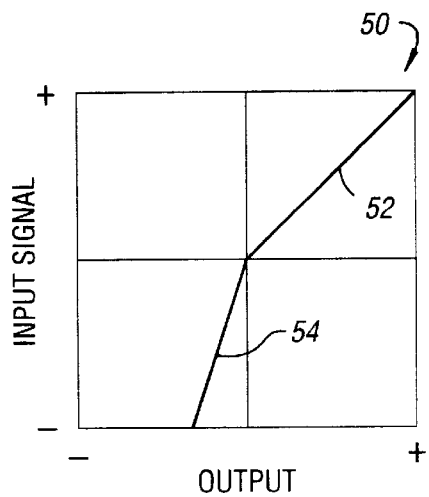
FIG. 5 illustrates an alternative embodiment or a system having a transfer function which produces even harmonic distortion according to the present invention.
Figure 6A:
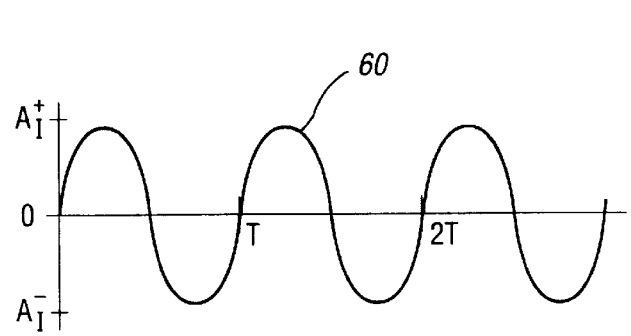
FIG. 6a illustrates a representative audio input signal.
Figure 6B:
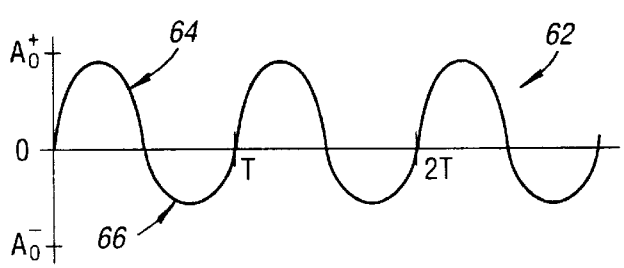

Referring now to FIG. 5, an alternative transfer function for use with the system and method according to the present invention is shown. Transfer function 50 includes a first linear portion 52 having a first slope $m_1$ and a second linear portion 54 having a second slope $m_2$. Preferably, the value of $m_1$ is about unity while the value of $m_2$ is less than unity. Thus, transfer function 50 applied to a representative input signal, such as the sinusoidal input signal 60 of FIG. 6a, results in a distorted sinusoidal signal 62 illustrated in FIG. 6b. As shown in FIG. 6a, input sinusoid 60 has symmetric positive half-cycles with an amplitude of $A_I^+$ and negative half-cycles with an amplitude of $A_I^-$ where $A_I^+$ is equal to $A_I^-$. The output signal illustrated in FIG. 6b, however, is asymmetric about the amplitude axis since the ratio of slopes $m_1/m_2$ is not equal to unity. Thus, the transfer function 50 emphasizes the even harmonics of the input signal by applying a greater gain to the positive half cycles 64 than the gain applied to the negative half cycles 66.

Figure 7:
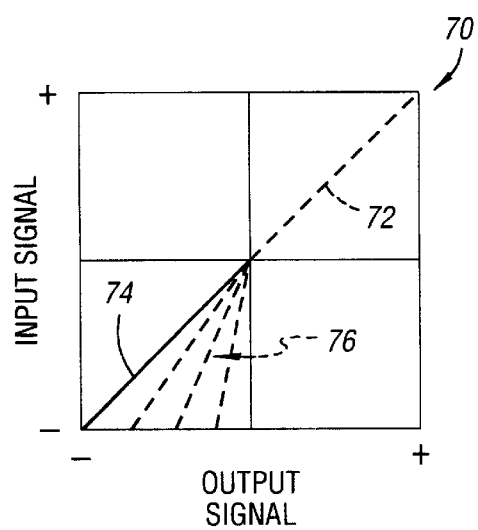
FIG. 7 illustrates an alternative embodiment of a transfer function for generating even harmonic distortion according to the present invention.

Referring now to FIG. 7, another embodiment of a transfer function for imparting even harmonic distortion to an audio signal according to the present invention is shown. Transfer function 70 includes a linear portion 72 which acts on the positive half cycles of the input signal and a linear portion 74 which provides variable distortion amounts as indicated by lines of differing slopes 76. Portion 74 of transfer function 70 operates on the negative half-cycles and may be selectively controlled by a particular user. For example, in a telephone transmission network, a particular caller may adjust the amount of distortion added to the signal so as to adapt the signal to the characteristics of the particular transmission line being utilized.

Referring now to FIG. 8, a representative electronic circuit is shown which adds even harmonic distortion to an input signal according to the present invention. Electronic circuit 80 acts upon an input applied at terminals 82 to produce an enhanced output signal at terminal 84. The circuit includes an amplifier 86, having negative feedback supplied through resistors 88,90, and diodes 92 and 94. Diodes 92 and 94 provide a non-linearity in the transfer function such that the gain for the positive and negative half-cycles may be selectively controlled to produce results such as those illustrated in FIG. 6b. Preferably, resistor 98 is a variable resistor, such as a potentiometer, to provide for variable negative half cycle gains which produce variable even harmonic distortion.

Referring now to FIG. 9, a block diagram illustrating an alternative implementation of the present invention is shown. An input signal is applied to terminal 100 and an output signal may be produced at terminal 102 or 104 depending upon the particular application. Block 106 represents a component having a non-linear transfer function which may be implemented via an electronic circuit or a programmed microprocessor as described herein. The output signal at terminal 104 may be used in systems which do not require further enhancement to the signal clarity. Block 108 represents a component having a gain which varies as a function of frequency. Thus, the function of block 108 is to boost high frequency components of the audio signal. Since this occurs after adding the even harmonic distortion, block 108 amplifies both the natural and artificial harmonics.

Another alternative implementation of a system for generating even harmonic distortion according to the present invention is illustrated in FIG. 10. An input signal is applied at terminal 120 and an output signal is obtained at terminal 130 or, if optional block 139 is utilized, at terminal 132. Block 134 represents selection of a portion of the frequencies in the bandlimited signal by applying a higher gain to those selected frequencies than the gain applied to the deselected frequencies. Block 136 introduces the non-linear, even harmonic distortion. Block 138 amplifies the higher frequency components of the enhanced signal which may be further enhanced at block 139 to "fill-out" or level the upper end of the limited bandwidth as explained in greater detail below.

Yet another embodiment for adding even harmonic distortion to an audio signal is illustrated in FIG. 11. An audio input signal is applied to terminal 140 and the enhanced audio output signal is generated at terminal 142. In this embodiment, a two-path approach is utilized. The input signal applied to terminal 140 is split, preferably equally, into a first path 146 and a second path 148. The second path includes a high-pass filter 150 which selects a portion of the frequencies for processing. Block 152 generates the even harmonic distortion for those frequencies selected by block 150. The original signal is then combined with the distorted signal by amplifier 154.

While the examples illustrated herein have nonlinearities for negative polarities, the roles of the positive and negative polarities may be reversed with the same effect without departing from the spirit or scope of the present invention.

Figure 12:
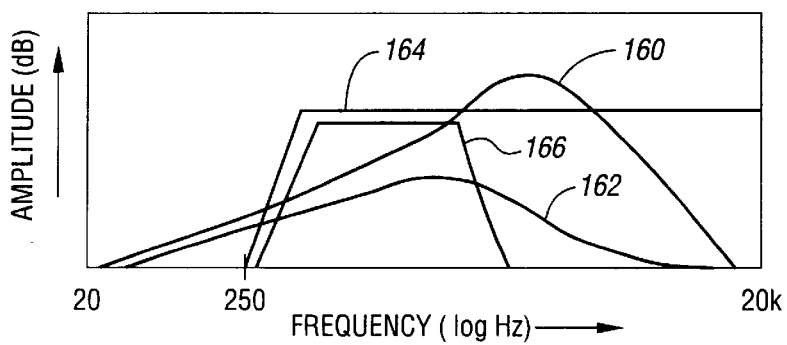
FIG. 12 is a diagram illustrating an approximate frequency response of the human ear and selection of frequencies for processing according to the present invention for use in a hearing aid.

Referring now to FIG. 12, a diagram illustrating an approximate frequency response of the human ear is shown. Of course, each individual will have a different frequency response curve which may change throughout his lifetime. Curve 160 represents the frequency response on a log scale for a person with normal hearing. Curve 162 represents the frequency response of a person with hearing loss which particularly attenuates higher frequency components. According to the present invention, input frequencies above some frequencies are selected for processing as indicated by bandwidths 164 or 166. Preferably, frequencies within bandwidth 166 are utilized such that the even harmonic distortion which is added to the signal to improve clarity falls within the bandwidth of the hearing impaired individual as represented by curve 162. Thus, bandwidth 166 may range from, for example, 250 Hz to about 2 KHz. Of course, the actual range may vary greatly depending upon the particular needs of the individual.

Figure 13:
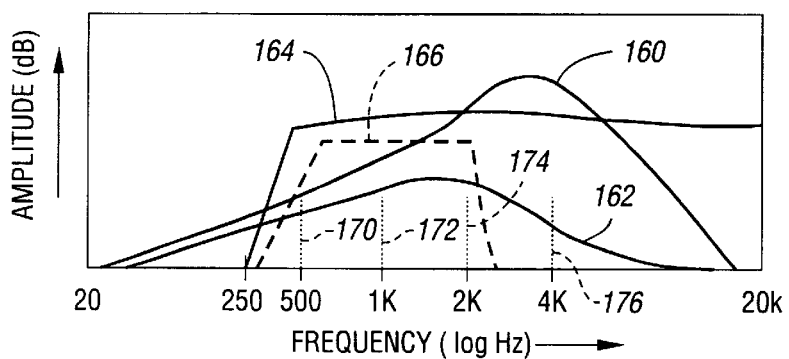
FIG. 13 illustrates even harmonic distortion generation according to the present invention for use with a hearing aid.

As illustrated in FIG. 13, even harmonics 172,174 and 176 are added to a 500 Hz input signal 170 such that all of the even harmonic distortion is added inside the lower bandwidth of the hearing impaired individual, making the sound higher in fidelity at the ear. This process improves sound quality and clarity especially for voice sounds and requires less amplification to help compensate for high frequency hearing loss. The present invention is particularly effective since, although speech energy is generated from about 50 Hz to about 10 KHz, the energy is greatest in the 400 Hz to 600 Hz range which includes both the fundamental components of the speech wave and the first formants. Thus, the present invention may also be utilized to enhance the clarity, quality, and intelligibility of speech signals for hearing aids.

Figure 14:
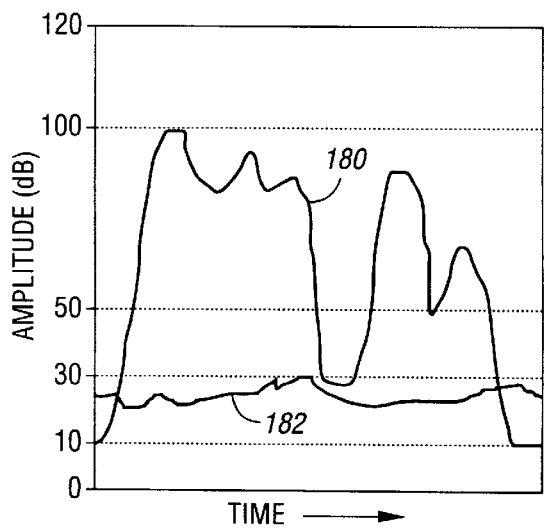
FIGS. 14 and 15 illustrate clarity improvement of audio signals according to the present invention while minimizing background noise.
Figure 15:
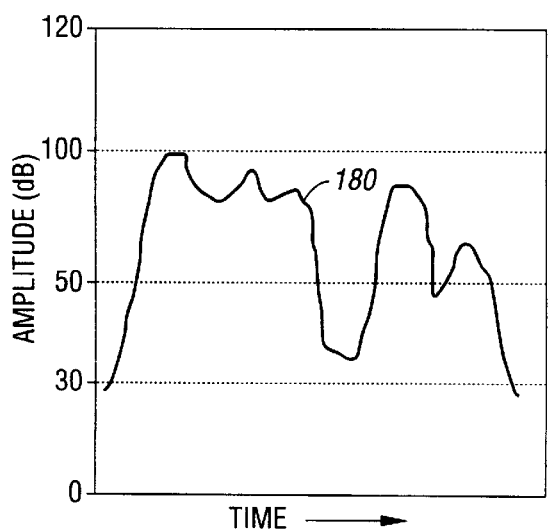

Referring now to FIGS. 14 and 15, another advantage of improving clarity of an audio signal according to the present invention is illustrated. A representative input signal 180 is illustrated as a function of time in FIG. 14. As shown, signal 180 has a relatively wide dynamic range which spans about 90 dB with background noise 182 ranging between 10 dB and 20 dB. FIG. 15 illustrates a reduced dynamic range of about 50 dB which may be representative of a telephone system or a person with hearing loss. Enhancement of the input audio signal 180 may be performed without enhancing background noise, especially when converting from a wide dynamic range to a narrow dynamic range as shown. Enhancement, even without audio compression can make some signals normally below the amplitude threshold of the limited dynamic range audible.

Thus, the present invention can be used to optimize normal wide band audio signals for use over standard telephone lines or other lower bandwidth systems, including lower bandwidth recordings. The process utilizes even harmonic distortion added to the audio signal at selected frequencies so that all of the second or fourth overtones of the distortion are heard by the listener and, as such, are not perceived as distortion, but rather as an improvement in clarity. For example, frequencies which will have distortion added for a 4 KHz maximum bandwidth will be those above 1 KHz to give one octave of enhanced clarity consisting of artificial second harmonic content. Similarly, for addition of second and fourth harmonics added to a 4 KHz signal, frequencies of maximum bandwidth of about 500 Hz are selected.

As described herein, the present invention works well with audio signals, such as those used in telephony and hearing aid applications. However, one of ordinary skill in the art will recognize that the present invention works equally well with other very low bandwidth signals, such as data compressed audio signals, computer voice files, computer audio files, and numerous other technologies which have an audio response less than normal human perception. The technique also applies to the use of perceptually coded audio.

While the best mode for carrying out the invention has been described in detail, those familiar with the art to which this invention relates will recognize various alternative designs and embodiments for practicing the invention as defined by the following claims.

What is claimed is:

1. A method of improving clarity of an audio signal within a communication channel having a limited bandwidth expressed as an upper frequency, the method comprising:

low-pass filtering the audio signal to attenuate frequency components of the audio signal above a cutoff frequency, the cutoff frequency no greater than one-half of the upper frequency;

amplifying portions of the filtered audio signal having an amplitude greater than zero by a first gain; and amplifying portions of the filtered audio signal having an amplitude less than zero by a second gain not equal to the first gain, wherein the amplification of portions of the filtered audio signal having an amplitude greater than zero by the first gain different than the second gain produces even harmonics within the limited bandwidth of the communication channel.

2. A method of improving clarity of an audio signal as in claim 1, wherein produced even harmonics comprises primarily second harmonic distortion.

3. A method of improving clarity of an audio signal as in claim 1 wherein the upper frequency is about 10 kilohertz and wherein the cutoff frequency is substantially one-quarter of the upper frequency.

4. A method of improving clarity of an audio signal as in claim 1 wherein the cutoff frequency is substantially one-eighth of the upper frequency and wherein produced even harmonics comprises primarily second and fourth harmonic distortion.

5. A method of improving clarity of an audio signal as in claim 1 wherein the first gain is unity and the second gain is variably adjustable.

6. A method of improving clarity of an audio signal as in claim 1 wherein the upper frequency is about 4 kilohertz, the method further comprising filtering the amplified portions of the filtered signal to boost high frequency components.

7. A telecommunication system comprising a plurality of transmitters, a plurality of receivers, and a switching system operable to connect one of the plurality of transmitters to one of the plurality of receivers by forming a communication channel, wherein each transmitter is operable to produce and audio signal, each receiver is operable to receive the audio signal, and each communication channel has a limited bandwidth described by an upper frequency, each channel comprising:

a low pass filter or band pass filter receiving the transmitted audio signal, the filter operable to attenuate frequency components of the audio signal above a cutoff frequency, the cutoff frequency no greater than one-half of the upper frequency; and a nonlinear amplifier receiving the filtered audio signal, the nonlinear amplifier operable to amplify portions of the filtered audio signal having an amplitude greater than zero by a first gain and to amplify portions of the filtered audio signal having an amplitude less than zero by a second gain not equal to the first gain, wherein the amplification of portions of the filtered audio signal having an amplitude greater than zero by the first gain different than the second gain produces even harmonics within the limited bandwidth of the communication channel.

8. A communication system as in claim 7 further comprising a second filter for receiving the amplified signal, the second filter operative to amplify frequencies above the cutoff frequency.

9. A communication system as in claim 7 wherein the first gain is unity and the second gain is variably adjustable.

* * * * *

UNITED STATES PATENT AND TRADEMARK OFFICE
CERTIFICATE OF CORRECTION

PATENT NO. : 6,023,513
DATED : February 8, 2000
INVENTOR(S) : Eliot M. Case

It is certified that error appears in the above-identified patent and that said Letters Patent is hereby corrected as shown below:

Column 2, line 53: after "embodiment" delete "or" and insert --for--

Signed and Sealed this

Twenty-seventh Day of March, 2001

Attest:

NICHOLAS P. GODICI

Attesting Officer

Acting Director of the United States Patent and Trademark Office